(12) United States Patent
Wei

(10) Patent No.: US 7,042,140 B2
(45) Date of Patent: May 9, 2006

(54) PIEZOELECTRIC-TRANSFORMER AND CARRIER ARRANGEMENT

(75) Inventor: Tao Chin Wei, Pingjhen (TW)

(73) Assignees: Midaswei Trading Co., Ltd., Taipei (TW); Champion Elite Company Limited, Tortola (VG)

( * ) Notice: Subject to any disclaimer, the term of this patent is extended or adjusted under 35 U.S.C. 154(b) by 0 days.

(21) Appl. No.: 11/029,414

(22) Filed: Jan. 6, 2005

(65) Prior Publication Data

US 2005/0269909 A1    Dec. 8, 2005

(30) Foreign Application Priority Data

Jun. 8, 2004    (TW) .............................. 93208992 U

(51) Int. Cl.
*H01L 41/053* (2006.01)
(52) U.S. Cl. ..................................... 310/348
(58) Field of Classification Search ................ 310/310, 310/348, 352–354
See application file for complete search history.

(56) References Cited

U.S. PATENT DOCUMENTS

| | | | | | |
|---|---|---|---|---|---|
| 2,937,293 | A | * | 5/1960 | Becker et al. ............... | 310/348 |
| 3,660,699 | A | * | 5/1972 | Sakurai et al. .............. | 310/326 |
| 3,678,309 | A | * | 7/1972 | Choffat ....................... | 310/353 |
| 5,109,177 | A | * | 4/1992 | Grellmann et al. ..... | 310/313 R |
| 5,281,935 | A | * | 1/1994 | Knecht et al. .............. | 333/187 |
| 5,917,272 | A | * | 6/1999 | Clark et al. ................. | 310/343 |
| 2002/0125795 | A1 | * | 9/2002 | Mori et al. .................. | 310/354 |

* cited by examiner

*Primary Examiner*—Thomas M. Dougherty
(74) *Attorney, Agent, or Firm*—Rosenberg, Klein & Lee

(57) ABSTRACT

A piezoelectric-transformer and carrier arrangement in which the carrier is press-molded from elastic material, for example, silicon rubber and has integrated binding belt and retainers for securing the piezoelectric-transformer to the carrier body, for enabling the input and output terminal lead wires of the piezoelectric-transformer to be directly connected to an external device, for example, a circuit board.

13 Claims, 5 Drawing Sheets

PIEZOELECTRIC-TRANSFORMER AND CARRIER ARRANGEMENT

BACKGROUND OF THE INVENTION

1. Field of the Invention

The present invention relates to a piezoelectric-transformer and carrier arrangement, and more specifically to a piezoelectric-transformer carrier, which is press-molded from elastic material to fit different sizes of piezoelectric-transformers.

2. Description of the Related Art

According to the conventional piezoelectric-transformer and carrier arrangement shown in FIGS. 1A and 1B, the piezoelectric-transformer, referenced by 1, comprises a piezoelectric strip 11, input terminal means 13 and output terminal means 14, lead wires 15 respectively extended from the input terminal means 13 and the output terminal means 14, and a mounting pad 17 at each end of the lead wires 15. The carrier, referenced by 3, is molded from plastics, having a trough 31 for accommodating the piezoelectric strip 11. After insertion of the piezoelectric strip 11 into the trough 31 of the carrier 3, the mounting pads 17 of the lead wires 15 are soldered to an external device, for example, a circuit board 7, and then the carrier 3 is inverted. The mounting pads 17 are provided at a fixed place, normally, the protruding part 33 of the trough 31. The protruding part 33 has the function of supporting the falling piezoelectric-transformer 1 when inverted the carrier 3.

The piezoelectric-transformer 1 involves conversion between voltage and stress. The specification of the piezoelectric strip 11 of the piezoelectric-transformer 1 affects conversion volume of voltage and operation frequency. For a different purpose of use, a different specification of piezoelectric strips 11 shall be used to match. However, because the carrier 3 is molded from plastics and not elastically deformable to change the size of the trough 31 within a wide range, different sizes of carriers 3 shall be used to fit different sizes of piezoelectric strips 11, thereby increasing the manufacturing cost.

SUMMARY OF THE INVENTION

The present invention has been accomplished under the circumstances in view. It is one object of the present invention to provide a piezoelectric-transformer carrier, which fits different sizes of piezoelectric strips. It is another object of the present invention to provide a piezoelectric-transformer and carrier arrangement, which can be installed practically so that increasing quality and quantity of soldering points and suitability of high frequency motion.

To achieve these and other objects of the present invention, the piezoelectric-transformer and carrier arrangement comprises a piezoelectric-transformer, which comprises a piezoelectric strip, and a carrier. Wherein the said carrier is press-molded from silicon rubber or suitable elastic material and adapted for carrying the piezoelectric strip of the piezoelectric-transformer. The carrier comprises a carrier body adapted to carry the piezoelectric strip; a binding belt adapted to hold down the piezoelectric strip on the carrier body, the binding belt having two ends connected to the carrier body; four retainers respectively connected to four corners of the carrier body at a top side for securing the piezoelectric strip to the carrier body; and two protruding blocks provided at the carrier body below the binding belt for supporting the piezoelectric strip above the carrier body; for special purpose, the piezoelectric strip can be adapted to a particular pattern wherein both the piezoelectric strip and the carrier has improved to match particular manner of installation.

DETAILED DESCRIPTION OF THE PREFERRED EMBODIMENT

Figure 1A:
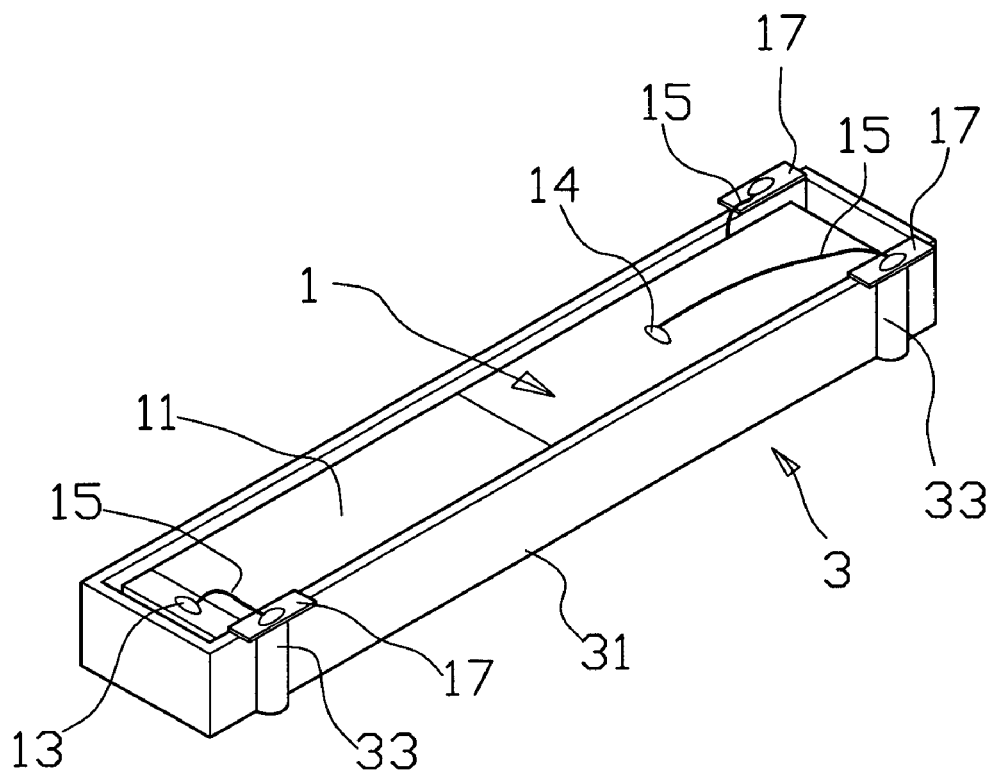
FIG. 1A is a schematic drawing showing a piezoelectric-transformer and carrier arrangement according to the prior art.
Figure 1B:
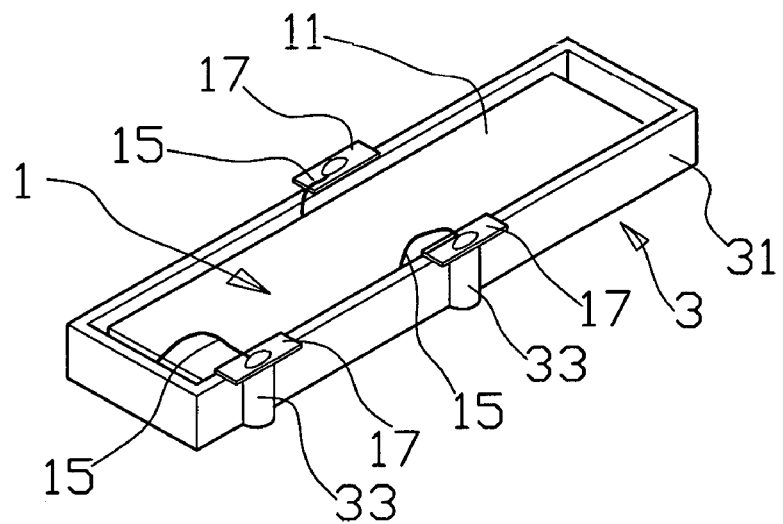
FIG. 1B is another schematic drawing of the prior art.
Figure 2:
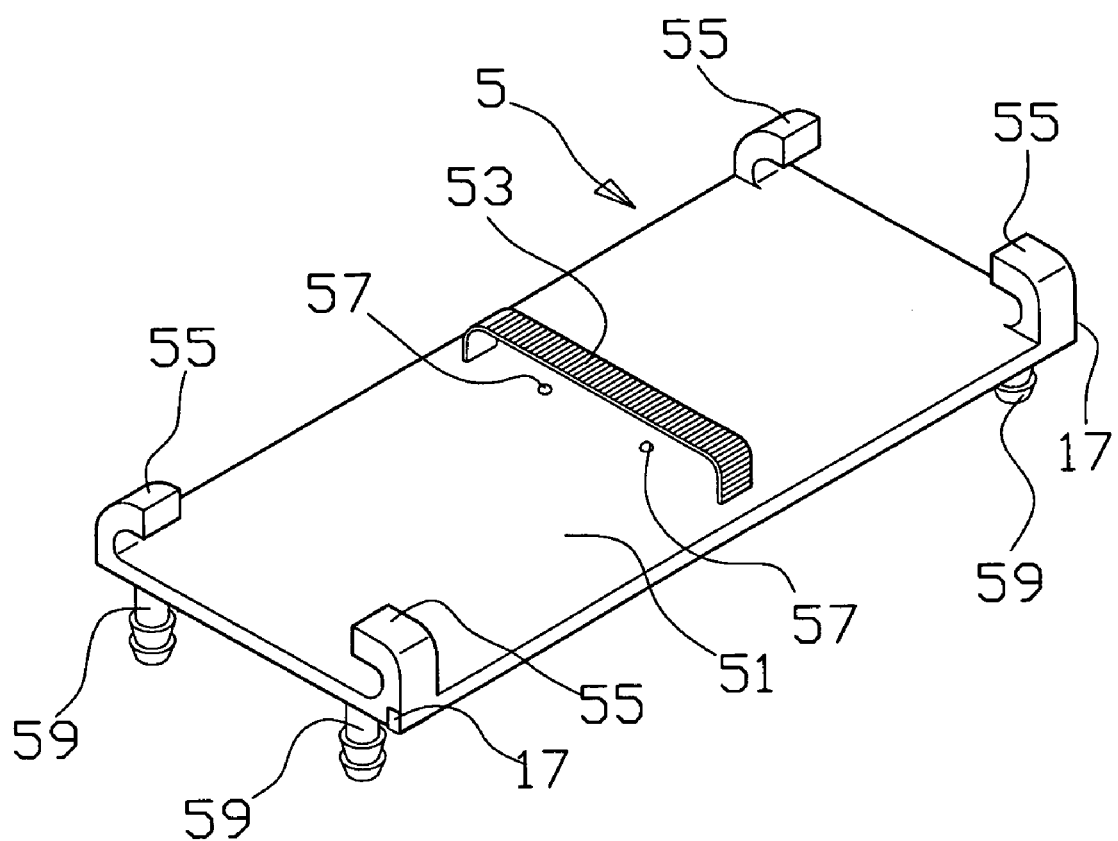
FIG. 2 is a schematic drawing of a piezoelectric-transformer carrier according to the present invention.

Referring to FIG. 2, a piezoelectric-transformer carrier 5 in accordance with the present invention is press-molded from elastic materials, for example, silicon rubber, comprising a carrier body 51, a binding belt 53, four retainers 55, and two protruding blocks 57. These members are all elastic. The carrier body 51 is mainly a tablet-like member. The binding belt 53 has two ends connected to the carrier body 51 at about the center area. The retainers 55 are respectively connected to the four corners at top side of the carrier body 51. The two protruding blocks 57 are provided at the top side of the carrier body 51 below the binding belt 53.

Figure 3:
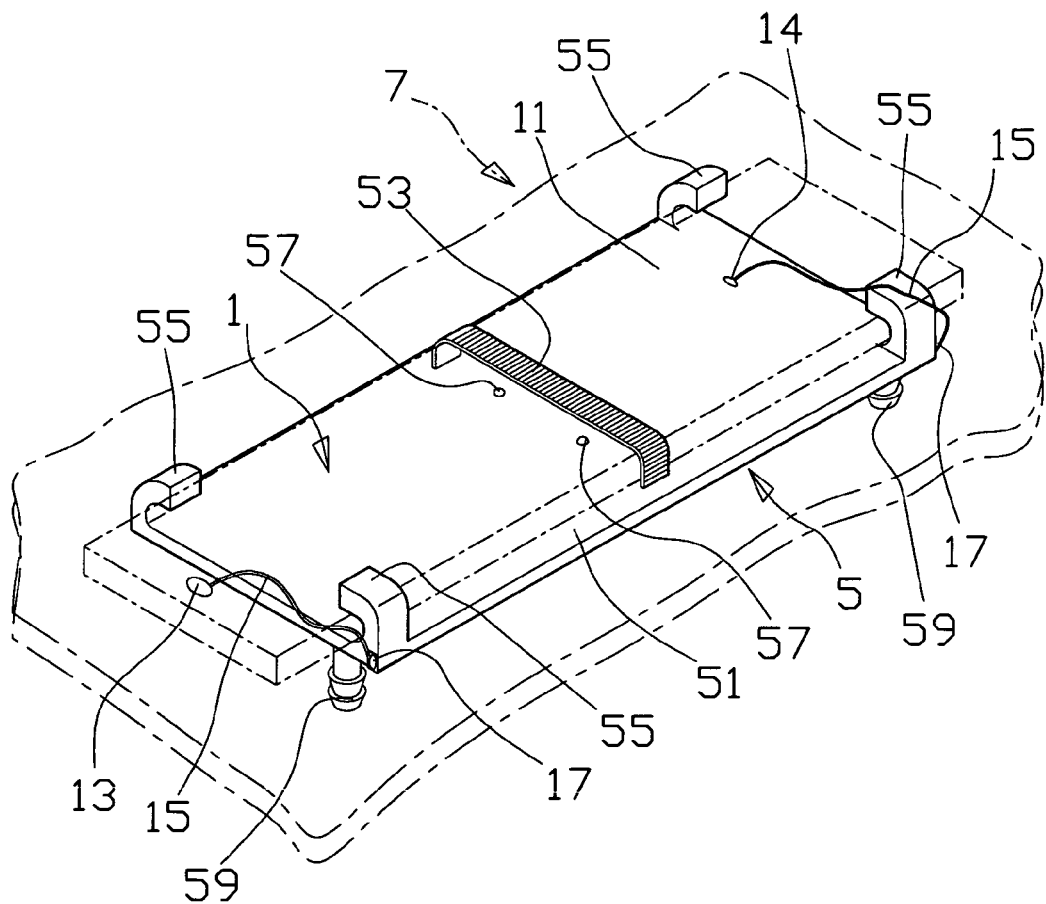
FIG. 3 is an installed view of the present invention.

Referring to FIG. 3, after placement of the piezoelectric strip 11 of the piezoelectric-transformer 1 on the carrier body 51, the binding belt 53 holds down the piezoelectric strip 11 on the carrier body 51, the retainers 55 secure the piezoelectric strip 11 to the four corners of the carrier body 51, and the protruding blocks 57 support the piezoelectric strip 11 above the carrier body 51. Thereafter, the mounting pads 17 of the piezoelectric-transformer 1 are installed in the bottom side of the retainers 55 and the carrier body 11. When viewed from lateral side at this time, it shows a substantially L-shaped profile. Thereafter, the mounting pads 17 are soldered to an external device, for example, a circuit board 7. Unlike conventional designs, the invention needs not to invert the piezoelectric-transformer carrier 5 during installation on the circuit board 7. Mounting pins 59 may be provided at the bottom side of the carrier body 51 in the four corners to enhance engagement between the piezoelectric-transformer carrier 5 and the external device 7, for example, the circuit board (see FIG. 4B).

Figure 4A:
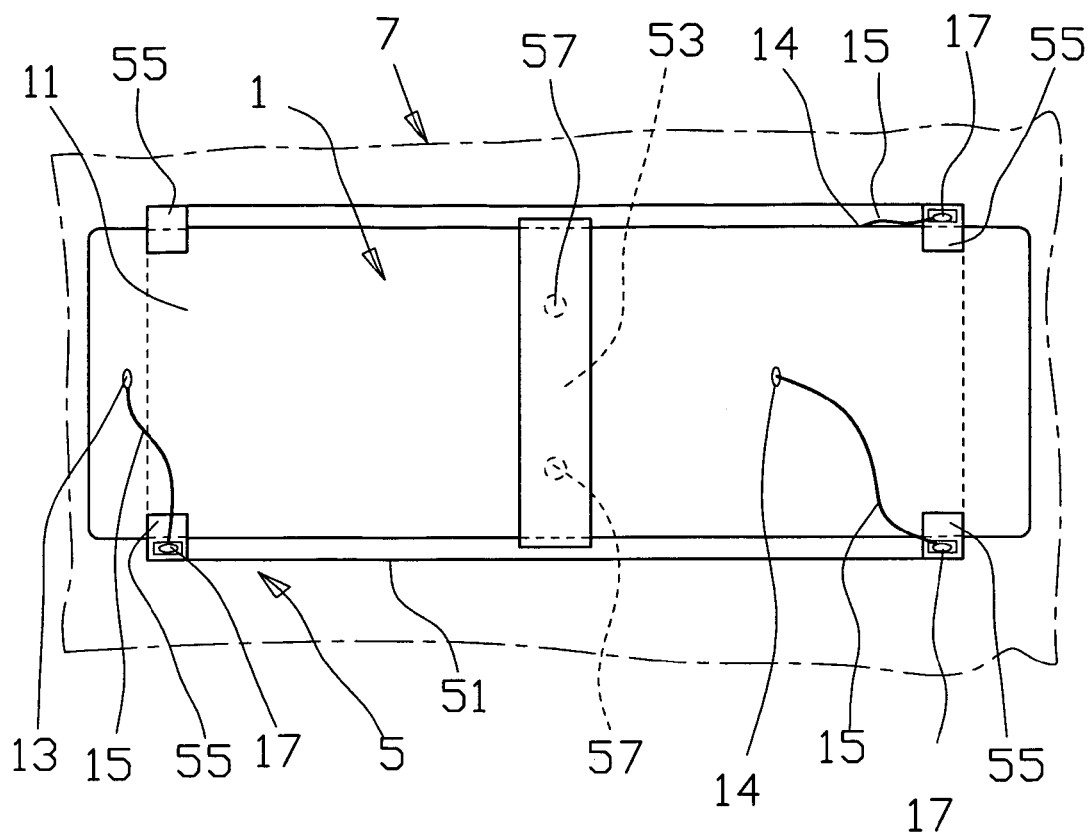
FIG. 4A is a schematic top view of the present invention.
Figure 4B:
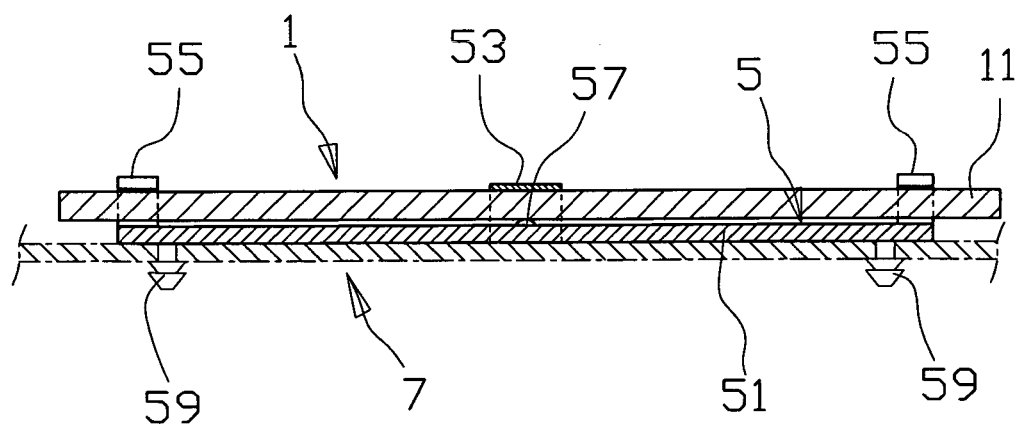
FIG. 4B is a schematic sectional view of the present invention.

Referring to FIG. 4A, because the piezoelectric-transformer carrier 5 is elastic, it can be stretched or compressed subject to the size of the piezoelectric strip 11. Therefore, the piezoelectric-transformer carrier 5 fits different sizes of piezoelectric strips.

Instead of the soldering position shown in FIG. 3, the mounting pads 17 of the piezoelectric-transformer 1 may be soldered to another part of the external device 7, for example, the circuit board.

A prototype of piezoelectric-transformer carrier has been constructed with the features of FIGS. 2~4. The piezoelectric-transformer carrier functions smoothly to provide all of the features discussed earlier.

Figure 5:
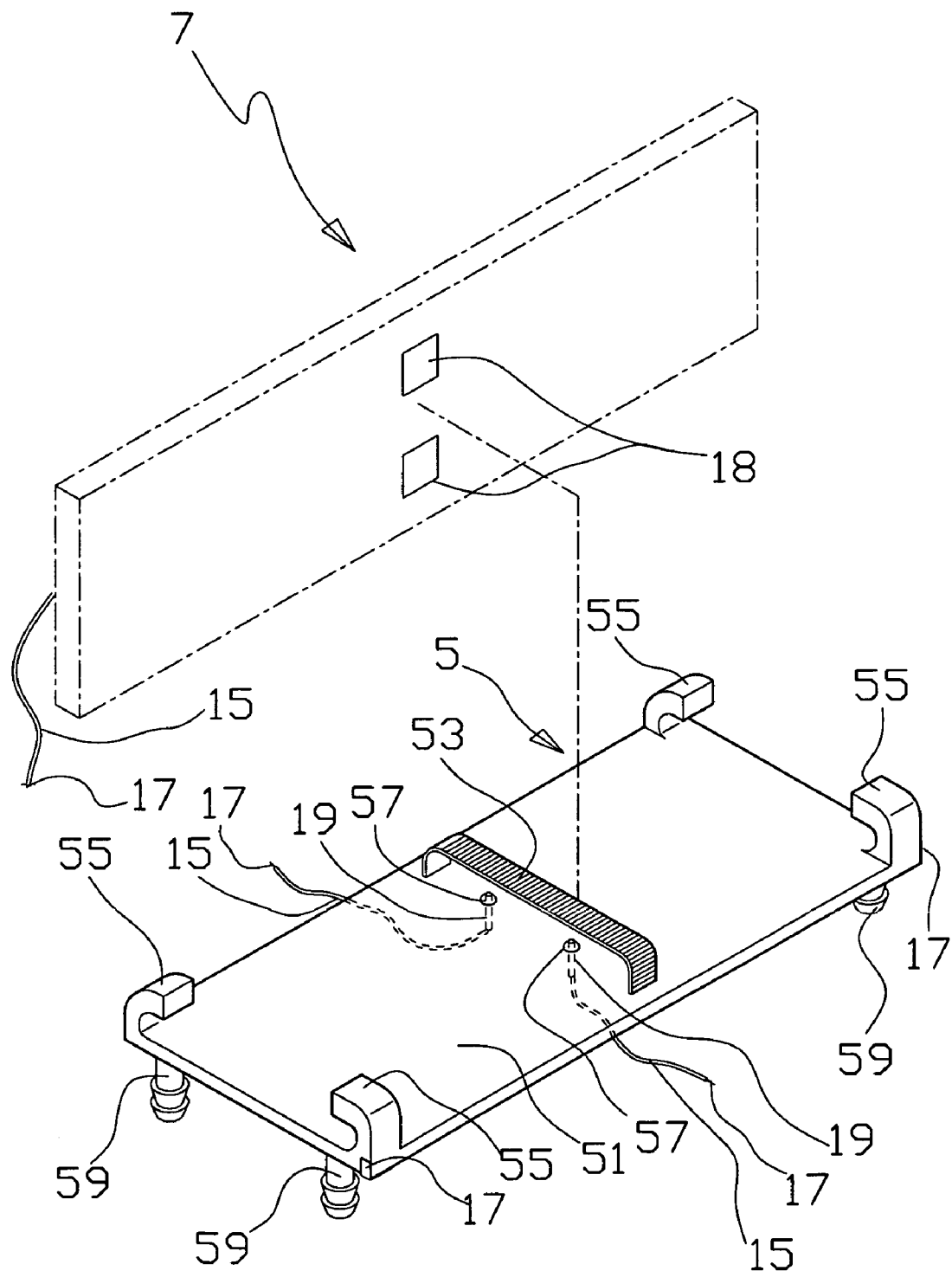
FIG. 5 shows another installation example of the present invention.

Referring to FIG. 5, there is another form of piezoelectric strip 11 which is improved slightly. To begin with, one output terminal mean 14 is put on the side of the piezoelectric strip 11 and connected to a lead wire 15 and a mounting pad 17 wherein the mounting pad 17 is soldered with an external device 7. To go on, two input terminal means 13 are put on the bottom of the piezoelectric strip 11 and replacing the said a lead wire 15 and a mounting pad 17 with a conductive pad 18. Furthermore, improving carrier body 51 of the piezoelectric-transformer carrier 5 by adding a procedure during it is manufactured, wherein the procedure is that to bury two lead wires 15 belonging to said two input terminal means 13 into the carrier body 51 wherein ends of two lead wires 15 sticking out two protruding blocks 57 respectively and adding electric poles 19 at another ends of two input terminal means 13. While installing the said improved piezoelectric strip 11, the binding belt 53 still holds down the piezoelectric strip 11 on the carrier body; two protruding blocks 57 which passed through the improvement, could support the piezoelectric strip 11 above the carrier body, in addition, serve as a part of circuit wherein the protruding blocks 57 connected to said two input terminal means 13 through the way contacting with electric poles 19 and conductive pads 18.

The improved manner of piezoelectric strip installation provides at least two advantages; at the first, reducing tiny variation of surrounding environment by improving quality and quantity of soldering points, and then further ensuring consistence of soldering points; at the next, improving suitability of high frequency motion by replacing contact manner from soldering with a mounting pad 17 to contacting by a conductive pad 18 and an electric pole 19, and then further ensuring stability of contacting points.

Although particular embodiments of the invention have been described in detail for purposes of illustration, various modifications and enhancements may be made without departing from the spirit and scope of the invention.

What the invention claimed is:

1. A piezoelectric-transformer and carrier arrangement, wherein the piezoelectric-transformer comprising a piezoelectric strip and a carrier which is formed of an elastic material and adapted to carry said piezoelectric strip, wherein said carrier comprises:

a carrier body adapted to carry said piezoelectric strip;

a binding belt adapted to hold down said piezoelectric strip on said carrier body, said binding belt having two ends connected to said carrier body;

four retainers respectively connected to four corners at top side of said carrier body for securing said piezoelectric strip to said carrier body; and two protruding blocks provided at said carrier body below said binding belt for supporting said piezoelectric strip above said carrier body.

2. The piezoelectric-transformer carrier as claimed in claim 1, wherein said elastic material is springy.

3. The piezoelectric-transformer carrier as claimed in claim 1, wherein said elastic material is silicon rubber and derivatives.

4. The piezoelectric-transformer carrier as claimed in claim 1, which is formed in integrity of said elastic material by press-molding.

5. The piezoelectric-transformer carrier as claimed in claim 1, wherein said binding belt fits different sizes of piezoelectric strips.

6. The piezoelectric-transformer carrier as claimed in claim 1, wherein said binding belt is provided at the center area of said carrier body.

7. The piezoelectric-transformer carrier as claimed in claim 1, further comprising four bottom mounting pins provided at the four corners at bottom side of said carrier body for mounting.

8. The piezoelectric-transformer carrier as claimed in claim 1, wherein said piezoelectric-transformer comprises input terminal means, output terminal means, lead wires respectively extended from said input terminal means and said output terminal means, and mounting pads respectively provided at said lead wires remote from said input terminal means and said output terminal means for fastening to an external device.

9. The piezoelectric-transformer carrier as claimed in claim 7, wherein said bottom mounting pins are help connecting to an external device.

10. The piezoelectric-transformer carrier as claimed in claim 8, wherein said mounting pads are fastened to said retainers and said carrier body at bottom side for connection to an external device.

11. The piezoelectric-transformer carrier as claimed in claim 8, wherein said external device is a circuit board.

12. The piezoelectric-transformer carrier as claimed in claim 9, wherein said external device is a circuit board.

13. The piezoelectric-transformer carrier as claimed in claim 10, wherein said external device is a circuit board.

\* \* \* \* \*